(12) United States Patent
Omura

(10) Patent No.: US 8,198,669 B2
(45) Date of Patent: Jun. 12, 2012

(54) SEMICONDUCTOR DEVICE AND METHOD FOR MANUFACTURING SAME

(75) Inventor: Mitsuhiro Omura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 198 days.

(21) Appl. No.: 12/615,120

(22) Filed: Nov. 9, 2009

(65) Prior Publication Data

US 2010/0176440 A1 Jul. 15, 2010

(30) Foreign Application Priority Data

Jan. 9, 2009 (JP) .................................. 2009-003901

(51) Int. Cl.
*H01L 29/792* (2006.01)

(52) U.S. Cl. ................. 257/324; 257/326; 257/E29.309

(58) Field of Classification Search .................. 257/324, 257/E29.309, E21.423, E21.294, 326, 329; 438/586

See application file for complete search history.

(56) References Cited

U.S. PATENT DOCUMENTS

| 6,498,092 B2 * | 12/2002 | Lee et al. ..................... 438/634 |
| 2008/0067583 A1 * | 3/2008 | Kidoh et al. ................. 257/326 |

FOREIGN PATENT DOCUMENTS

| JP | 2007-266143 | 10/2007 |
| JP | 2008-72051 | 3/2008 |
| KR | 2002-0009211 | 2/2002 |
| KR | 10-2007-0094150 | 9/2007 |
| KR | 10-2007-0096972 | 10/2007 |

OTHER PUBLICATIONS

Notification of Comments issued by the Korean Patent Office on Apr. 13, 2011, for Korean Patent Application No. 10-2010-1817, and English-language translation thereof.

* cited by examiner

*Primary Examiner* — Chuong A Luu
*Assistant Examiner* — Nga Doan
(74) *Attorney, Agent, or Firm* — Finnegan, Henderson, Farabow, Garrett & Dunner, L.L.P.

(57) ABSTRACT

A semiconductor device includes: a first layer; a second layer; a columnar structural unit; and a side portion. The second layer is provided on a major surface of the first layer. The columnar structural unit is conductive and aligned in the first layer and the second layer to pass through the major surface. The side portion is added to a side wall of the columnar structural unit on the second layer side of the major surface.

13 Claims, 14 Drawing Sheets

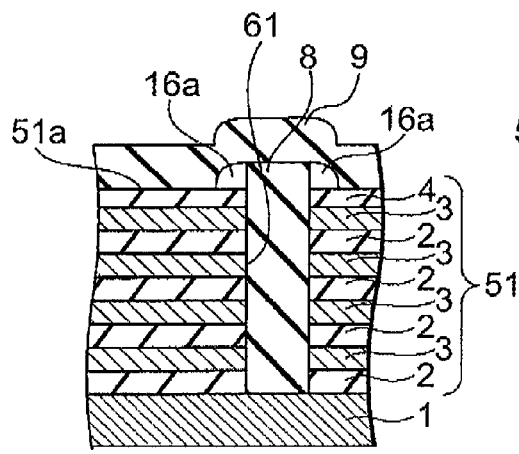
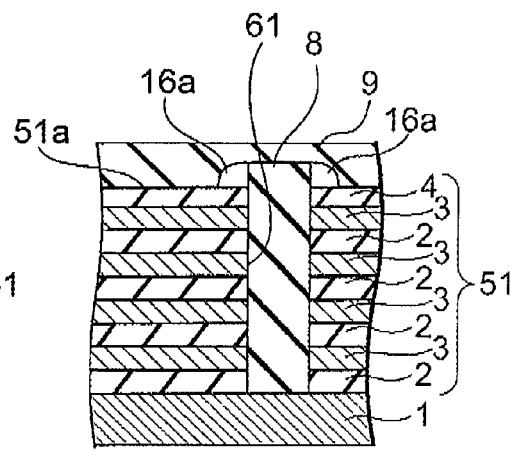
FIG. 6A  FIG. 6B
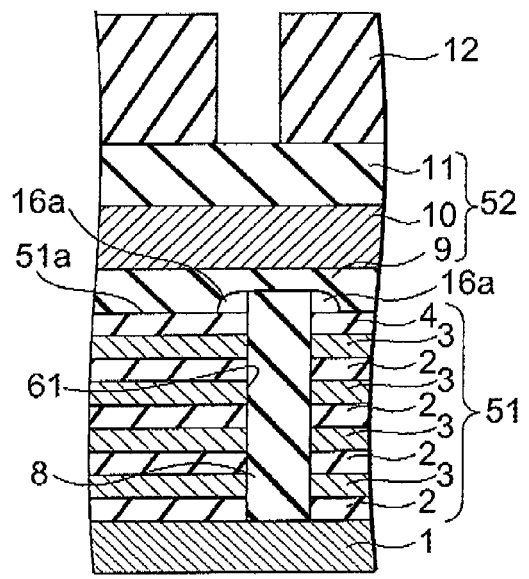
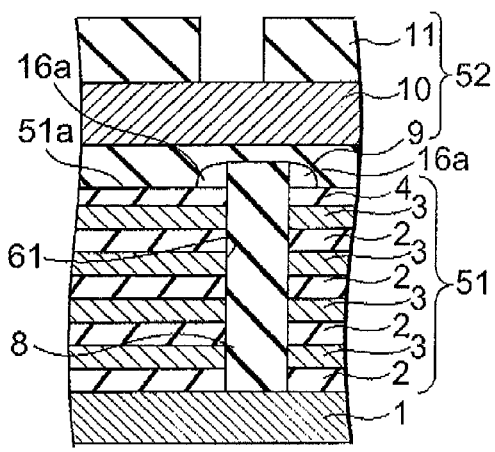
FIG. 6C  FIG. 6D

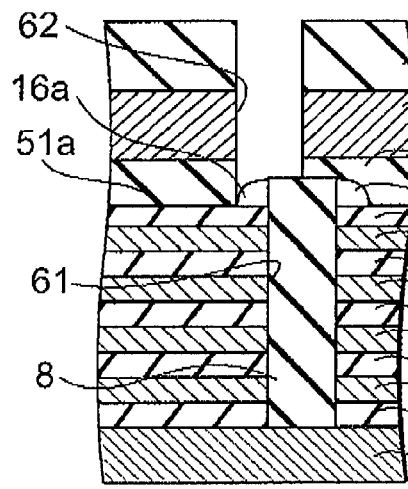
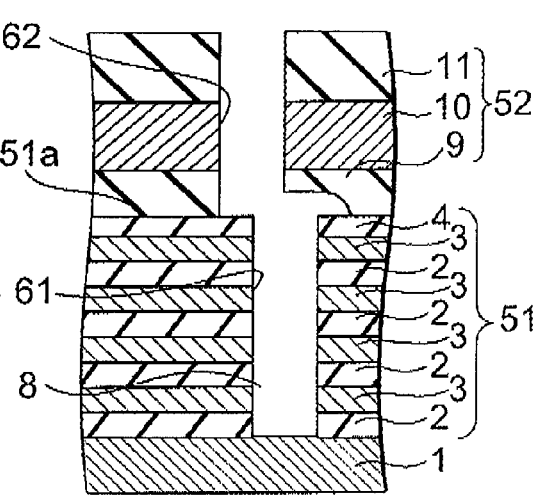
FIG. 7A        FIG. 7B
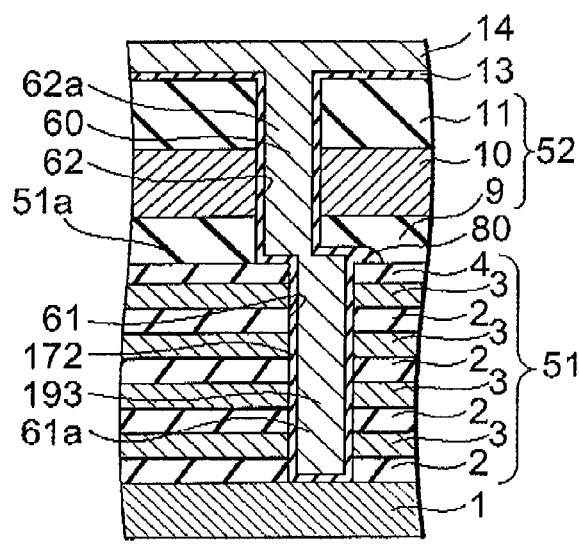
FIG. 7C

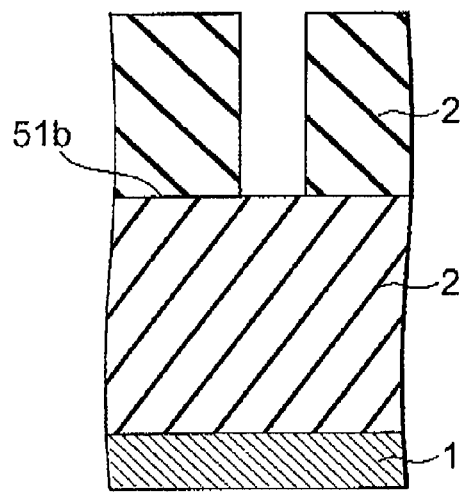
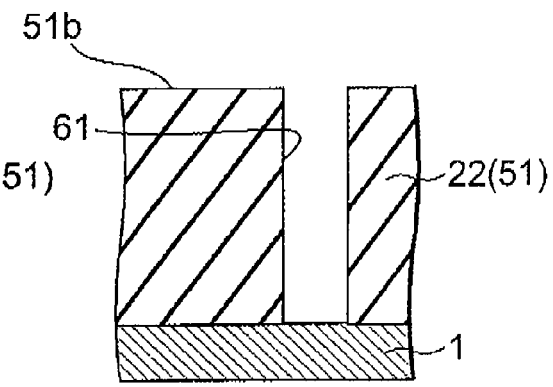
FIG. 14A    FIG. 14B
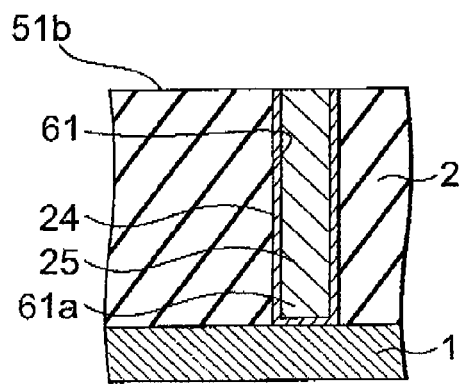
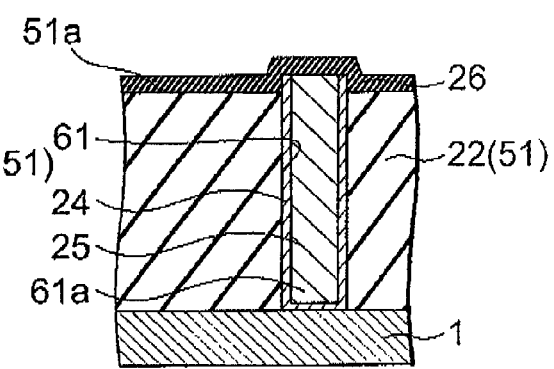
FIG. 14C    FIG. 14D

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2009-003901, filed on Jan. 9, 2009; the entire contents of which are incorporated herein by reference.

BACKGROUND OF THE INVENTION

1. Field of the Invention

The invention relates to a semiconductor device and a method for manufacturing the same.

2. Background Art

Nonvolatile semiconductor memory devices of flash memory and the like conventionally are constructed by two-dimensionally integrating memory cells on a surface of a silicon substrate. Conversely, technology is proposed to three-dimensionally integrate memory cells for further improvement of the bit density. However, general three-dimensional devices suffer from increased costs accompanying increased lithography steps because several lithography steps are necessary for each layer of the device.

Conversely, collectively patterned three-dimensional stacked memory has been proposed (for example, refer to JP-A 2007-266143 (Kokai)). In such technology, for example, a stacked unit is formed on a silicon substrate by alternately stacking electrode films and insulating films. Through-holes are then made in the stacked unit by collective processing. A charge storage layer is formed on a side face of each through-hole, and silicon is filled into the interior of the through-hole to form a silicon pillar (columnar semiconductor). A charge storage layer-type memory cell is thereby formed at an intersection between each electrode film and the silicon pillar. Because the memory cells are formed collectively, the problems regarding cost are expected to be solved.

A semiconductor device having such a structure includes a first pillar provided in a first layer forming, for example, the memory cells to be directly linked to a second pillar provided in a second layer on the first layer forming, for example, a selection gate transistor portion.

At this time, lithography alignment shift occurs when forming the first pillar and the second pillar and is accompanied by difficulties during manufacturing. Therefore, technology is proposed to increase the diameter of the connection portion between the first pillar and the second pillar to increase the tolerance of the alignment shift (for example, refer to JP-A 2008-72051 (Kokai). However, the steps of such methods are complex, and room for improvement exists.

Further, deterioration of device characteristics of memory cells occurs when, for example, the through-hole forming the second pillar reaches the uppermost memory cell layer of the first layer when forming the second pillar.

SUMMARY OF THE INVENTION

According to an aspect of the invention, there is provided a semiconductor device, including: a first layer; a second layer provided on a major surface of the first layer; a columnar structural unit aligned in the first layer and the second layer to pass through the major surface, the columnar structural unit being conductive; and a side portion added to a side wall of the columnar structural unit on the second layer side of the major surface.

According to another aspect of the invention, there is provided a semiconductor device, including: a first layer; a second layer provided on a major surface of the first layer; and a columnar structural unit aligned in the first layer and the second layer to pass through the major surface, columnar structural unit being conductive, the columnar structural unit including a protruding portion on the second layer side of the major surface, the protruding portion protruding in a direction orthogonal to the alignment direction.

According to another aspect of the invention, there is provided a method for manufacturing a semiconductor device including a first layer, a second layer provided on a major surface of the first layer, and a columnar structural unit aligned in the first layer and the second layer to pass through the major surface, the columnar structural unit being conductive, the method including: forming a layer configured to form the first layer above a substrate; making a first hole aligned in a direction orthogonal to the major surface from an upper face of the layer configured to form the first layer toward the substrate side; filling a third layer into an interior of the first hole; causing the upper face of the layer configured to form the first layer to recede to the major surface of the first layer to expose a side wall of the third layer; forming a fourth layer on the side wall of the exposed third layer; forming the second layer to cover the first layer, the third layer, and the fourth layer; making a second hole from an upper face of the second layer to pass through the second layer and reach the third layer; and filling a conductive material into an interior of the second hole.

BRIEF DESCRIPTION OF THE DRAWINGS

FIGS. 6A to 6D are schematic cross-sectional views in order of the steps, continuing from FIG. 5D;

FIGS. 7A to 7C are schematic cross-sectional views in order of the steps, continuing from FIG. 6D;

FIGS. 14A to 14D are schematic cross-sectional views in order of the steps, illustrating a method for manufacturing the semiconductor device according to the second example of the invention;

DETAILED DESCRIPTION OF THE INVENTION

Figure 1:
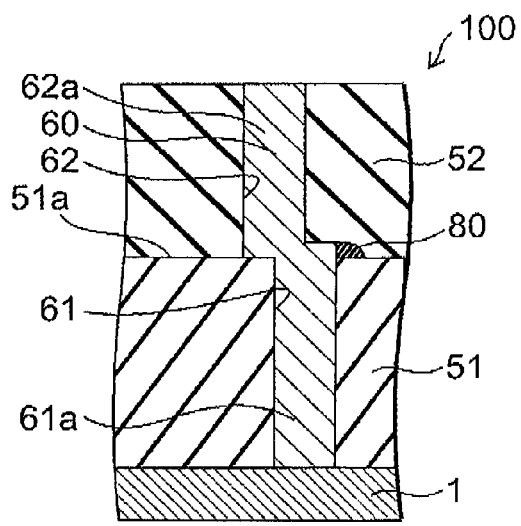
FIG. 1 is a schematic cross-sectional view illustrating the configuration of main components of a semiconductor device according to a first embodiment of the invention.

Embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification and drawings, components similar to those described in regard to a drawing thereinabove are marked with like reference numerals, and a detailed description is omitted as appropriate.

First Embodiment

FIG. 1 is a schematic cross-sectional view illustrating the configuration of main components of a semiconductor device according to a first embodiment of the invention.

As illustrated in FIG. 1, a semiconductor device 100 according to the first embodiment of the invention includes a substrate 1, a first layer 51 provided on the substrate 1, a second layer 52 provided on a first major surface 51a (the major surface) on the side of the first layer 51 opposite to the substrate 1, and a columnar structural unit 60 aligned in the first layer 51 and the second layer 52 to pass through the first major surface 51a. The columnar structural unit 60 is conductive.

The columnar structural unit 60 is aligned in a direction orthogonal to the first major surface 51a. The columnar structural unit 60 includes a first column 61a filled into a first hole 61 made in the first layer 51 and a second column 62a filled into a second hole 62 made in the second layer 52.

As illustrated in FIG. 1, the first hole 61 and the second hole 62 are made in separate steps. Although the alignment axes of the first hole 61 and the second hole 62 are shifted in a plane parallel to the first major surface 51a due to the alignment shift of the lithography of each of the steps, the first column 61a filled into the interior of the first hole 61 communicates with the second column 62a filled into the interior of the second hole 62, and the first column 61a and the second column 62a are electrically connected. Thus, the alignment axis of the columnar structural unit 60 may be shifted at the interface between the first layer 51 and the second layer 52.

Although the columnar structural unit 60 is provided to pass through the first layer 51 and the second layer 52 in this specific example, the invention is not limited thereto. The columnar structural unit 60 may be provided in at least a portion of the first layer 51 and at least a portion of the second layer 52.

The first layer 51 may include at least one selected from a semiconductor layer, a conductive layer, an insulating layer, and a stacked film thereof. The second layer 52 may include at least one selected from a semiconductor layer, a conductive layer, an insulating layer, and a stacked film thereof.

The columnar structural unit 60, i.e., the first column 61a and the second column 62a, may include any conductive material such as various metals including copper (Cu), aluminum (Al), tungsten (W), gold (Au), titanium (Ti), tantalum (Ta); and polysilicon, amorphous silicon, and the like doped with an impurity. The first column 61a and the second column 62a may be formed of the same material or may be formed of different materials.

The semiconductor device 100 further includes a side portion 80 added to the side wall of the columnar structural unit 60 on the second layer 52 side of the first major surface 51a. The side portion 80 is provided on at least a portion of the side wall of the columnar structural unit 60. As described below, the side portion 80 is a portion functioning to protect the first layer 51, that is, performing the role of an etching stopper, when making the second hole 62 in the second layer 52 for the formation of the second column 62a. Alternatively, the side portion 80 is a portion where the portion functioning to protect the first layer 51, that is, performing the role of an etching stopper, is removed and then filled with another material.

The side portion 80 may include, for example, an insulating material such as silicon nitride, silicon carbide, and aluminum oxide. The side portion 80 also may be a stacked film of, for example, silicon oxide, silicon nitride, and silicon oxide. A conductive material such as polysilicon, amorphous silicon, and the like also may be used as the side portion 80. Further, as described below, the side portion 80 may be a void.

In other words, the side portion 80 may be a portion functioning as an etching stopper when making the second hole 62 and remaining after the etching step, another material filled into where the portion is removed after the etching step, or the void remaining as-is after the portion is removed after the etching step.

In the semiconductor device 100 having such a configuration, the step of making the second hole 62 in the second layer 52 does not damage the upper face of the first layer 51 because the side portion 80 is provided on the first major surface 51a of the first layer 51 to function as an etching stopper. Thereby, a semiconductor device can be provided having a higher tolerance of lithography alignment shift during the formation of the columnar structural unit 60 and suppressed deterioration of the device characteristics.

The columnar structural unit 60 (i.e., the first column 61a and the second column 62a) and the side portion 80 may be formed of substantially the same material. In such a case, the side portion 80 may be considered to be a protruding portion provided on the columnar structural unit 60.

The semiconductor device 100 according to this embodiment having the structures recited above may be any semiconductor device having a structure including the first layer 51, the second layer 52 provided thereupon, and the columnar structural unit 60 formed in the first layer 51 and the second layer 52. In particular, the semiconductor device 100 may be assumed to be a collectively patterned three-dimensional stacked memory. A collectively patterned three-dimensional stacked memory will now be described as an example of this embodiment.

First Example

Figure 2:
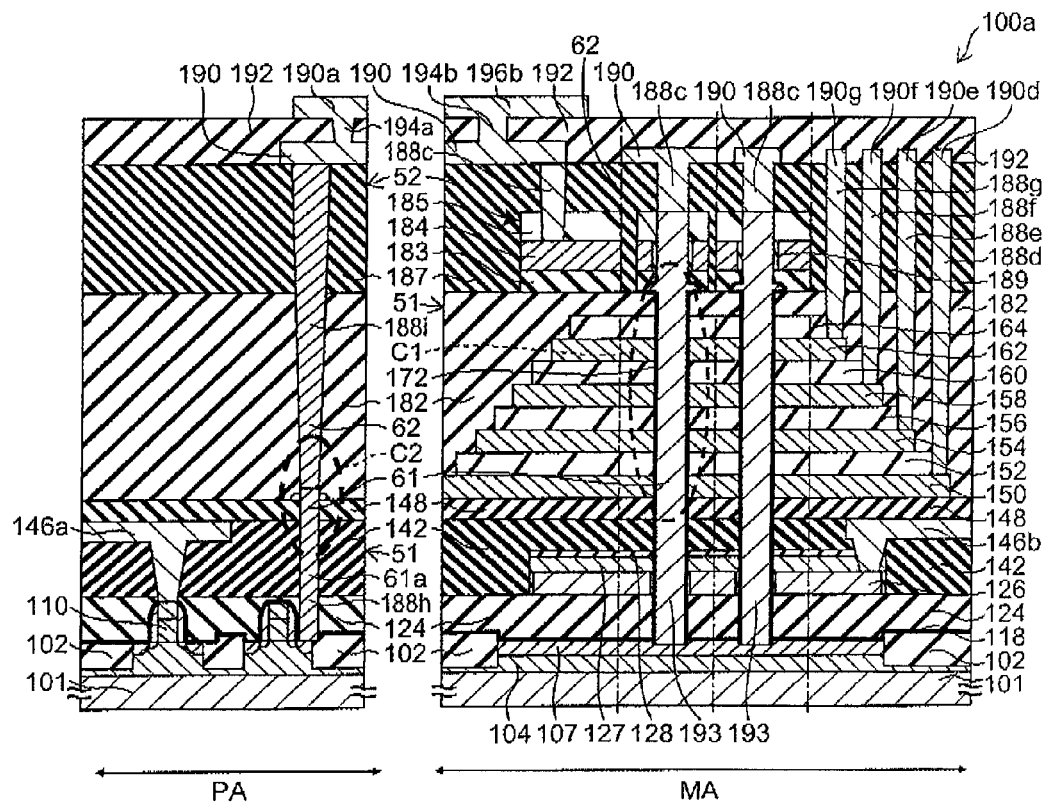
FIG. 2 is a schematic cross-sectional view illustrating the configuration of a semiconductor device according to a first example of the invention.

FIG. 2 is a schematic cross-sectional view illustrating the configuration of a semiconductor device according to a first example of the invention.

As illustrated in FIG. 2, a semiconductor device 100a according to the first example is a collectively patterned three-dimensional stacked memory. Namely, a stacked unit including alternately stacked electrode films and insulating films is provided on a substrate 101 made of silicon; through-holes are collectively patterned in the stacked unit; an ONO (Oxide Nitride Oxide) film 172 forming a charge storage layer is provided on the side face of each of the through-holes; and a silicon pillar is formed by filling silicon into the interior of each of the through-holes. Thereby, a memory cell is formed at the intersection between each of the electrode films and the silicon pillar. The portion on the right side of FIG. 2 is a memory transistor region MA, and the portion on the left side is a peripheral circuit region PA.

In the memory transistor region MA, an STI (Shallow Trench Isolation) 102 is provided on the substrate 101 for element separation. A P well region 104 is provided on the substrate 101. An n⁺ diffusion region 107 is provided thereupon. A silicon nitride film 118, i.e., a barrier layer, is provided thereupon. A BPSG (Boron Phosphor Silicate Glass) film 124 is provided thereupon as a planarization film. A conducting film 126 to form an interconnect, a TEOS (Tetra Ethyl Ortho Silicate) film 127, and a silicon nitride film 128 are provided thereupon. An interconnect 146b is provided to conduct to the conducting film 126. A silicon oxide film 142 is filled therearound.

A silicon oxide film 148 is provided thereupon. Electrode films 150, 154, 158, and 162 are alternately stacked thereupon with silicon oxide films 152, 156, 160 and 164 on the silicon oxide film 148. The electrode films 150, 154, 158, and 162 are made of conducting films such as amorphous silicon, polysilicon, and the like. The silicon oxide films 152, 156, 160, and 164 form insulating films between the control gates. The BPSG film 182 is provided therearound as an inter-layer insulating film.

In this example, the BPSG film 182 and the layers below the BPSG film 182 (the layers on the substrate 101 side) form the first layer 51.

The first hole 61 is made in the stacked films of the electrode films 150, 154, 158, and 162 and the silicon oxide films 152, 156, 160, and 164. An ONO film 172 of a silicon oxide film, a silicon nitride film, and a silicon oxide film forming a charge storage layer (a stacked film including a first silicon oxide film, a second silicon oxide film, and a silicon nitride film provided between the first silicon oxide film and the second silicon oxide film) is formed on the side wall of the first hole 61. A semiconductor material is filled inside the first hole 61 to provide a semiconductor pillar 193 (a semiconductor layer). Thereby, a memory cell having a storage unit of the ONO film 172 of the charge storage layer is formed at the intersection between the semiconductor pillar 193 and each of the electrode films 150, 154, 158, and 162.

A silicon oxide film 183, a polysilicon film 184 forming selection gate lines, and an insulating film 185 are provided on the BPSG film 182.

In this specific example, the silicon oxide film 183, the polysilicon film 184, and the insulating film 185 form the second layer 52.

The second hole 62 is made in the silicon oxide film 183, the polysilicon film 184, and the insulating film 185. A thermal oxide film 189 forming the gate insulating film of the selection gate transistor is provided on the face of the inner side of the polysilicon film 184. A semiconductor material is filled into the interior of the second hole 62 to form the channel portion of the selection gate transistor and provide the semiconductor pillar 193.

Thus, in this specific example, the semiconductor pillar 193, i.e., the same material, is filled into the first hole 61 and the second hole 62. Amorphous silicon or polysilicon may be used as the semiconductor pillar 193. The semiconductor pillar 193 forms the columnar structural unit 60.

A silicon oxide film 187 forming an inter-layer insulating film is provided around the silicon oxide film 183, the polysilicon film 184, and the insulating film 185. An electrode 190 connected to a connection plug 188c is provided. A BPSG film 192 forming an inter-layer insulating film is provided thereupon. An electrode 196b connected by the electrode 190 and a connection plug 194b is provided thereupon.

As illustrated in FIG. 2, the lengths in the alignment direction of the electrode films 150, 154, 158, and 162 and the silicon oxide films 152, 156, 160, and 164 gradually change in a stairstep configuration. The electrode films 150, 154, 158, and 162 are connected to electrodes 190d, 190e, 190f, and 190g by connection plugs 188d, 188e, 188f, and 188g, respectively.

On the other hand, in the peripheral circuit region PA, the STI 102 and a peripheral circuit transistor 110 are provided on the substrate 101. The BPSG film 124 is provided as a planarization film thereupon. An interconnect 146a is provided thereupon. The silicon oxide film 142 is filled therearound. The silicon oxide film 148 is provided thereupon.

In the peripheral circuit region PA, the silicon oxide film 142 and the silicon oxide film 148 recited above form the first layer 51.

The first hole 61 is made to pass through the silicon oxide film 142 and the silicon oxide film 148. Metal, for example, is filled into the interior of the first hole 61 to form a connection plug 188h as the first column 61a. Any conductive material may be used as the connection plug 188h.

The BPSG film 182 is provided on the silicon oxide film 148. The silicon oxide film 187 is provided thereupon. The electrode 190, the connection plug 194a, and the BPSG film 192 are provided thereupon. The electrode 190a connected to the connection plug 194a is provided on the BPSG film 192.

In the peripheral circuit region PA, the BPSG film 182 and the silicon oxide film 187 form the second layer 52. The second hole 62 is made to pass through the BPSG film 182 and the silicon oxide film 187. Metal, for example, is filled into the interior of the second hole 62 to form a connection plug 188i as the second column 62a. Any conductive material may be used as the connection plug 188i.

Thus, the semiconductor device 100a is a charge storage layer-type nonvolatile memory device including a collectively patterned three-dimensional stacked memory in the memory transistor region MA. Namely, the semiconductor device 100a is a four-layer nonvolatile memory device having four stacked layers of each of the electrode films 150, 154, 158, and 162 and the silicon oxide films 152, 156, 160, and 164. In other words, in the semiconductor device 100a, the first layer 51 includes the stacked unit in which multiple electrode films are alternately stacked with multiple insulating films. Here, the number of each of the stacked electrode films and insulating films may be more than four layers, and the bit density can be thereby improved. However, the number of layers of the electrode films and the insulating films is arbitrary. For example, more than four layers may be stacked, and multiple layers less than four layers may be used. The case of a stacked structure having four layers will be described below.

In the semiconductor device 100a, this embodiment may be applied to, for example, a contact portion C1 of the memory transistor region MA. This embodiment also may be applied to a contact portion C2 of the peripheral circuit region PA as described below in a second example.

First, an example in which this embodiment is applied to the contact portion C1 will be described.

Figure 3:
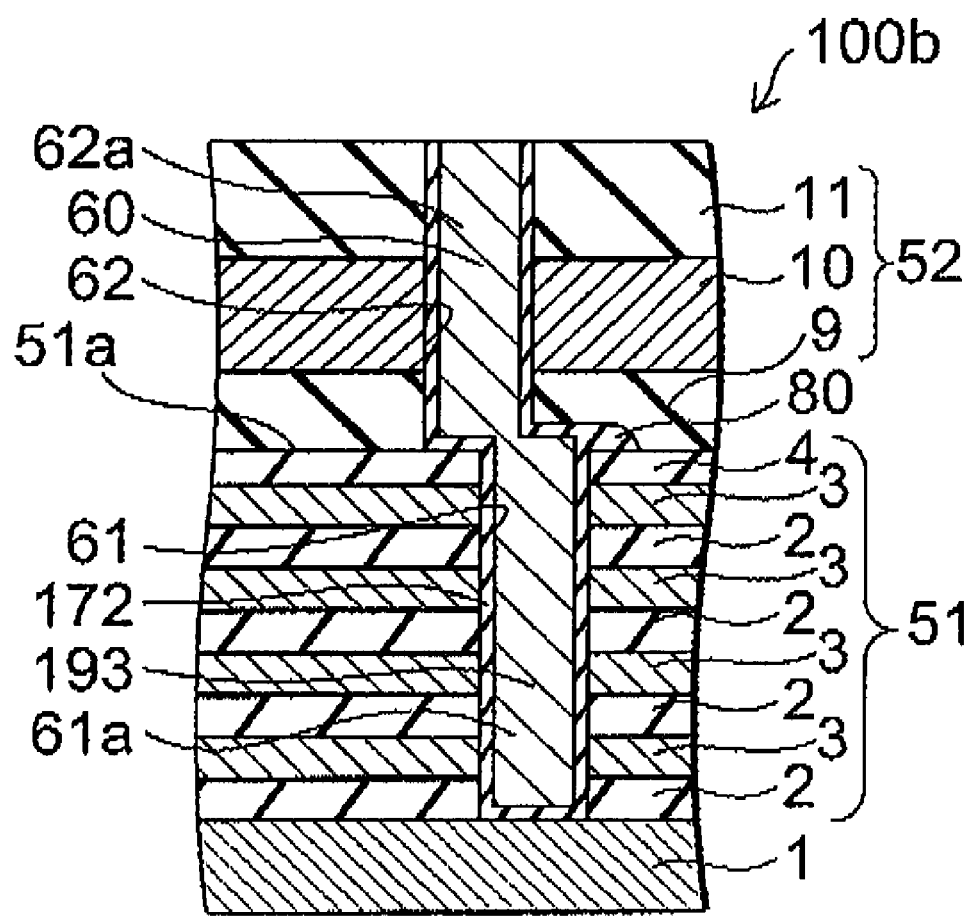
FIG. 3 is a schematic cross-sectional view illustrating the configuration of main components of the semiconductor device according to the first example of the invention.

FIG. 3 is a schematic cross-sectional view illustrating the configuration of main components of the semiconductor device according to the first example of the invention.

As illustrated in FIG. 3, a semiconductor device 100b according to this example includes the substrate 1, the first layer 51 provided on the substrate 1, the second layer 52 provided on the first major surface 51a of the first layer 51 on the side opposite to the substrate 1, and a columnar structural unit 60 aligned in the first layer 51 and the second layer 52 to pass through the first major surface 51a. The columnar structural unit 60 is conductive.

The substrate 1 corresponds to the substrate 101 illustrated in FIG. 2.

The columnar structural unit 60 includes the first column 61a filled into the first hole 61 made in the first layer 51 and the second column 62a filled into the second hole 62 made in the second layer 52.

In this specific example, the first layer 51 includes a stacked structural unit of multiple conductive electrode films 3 alternately stacked with multiple insulating films 2 and a first inter-layer silicon oxide film 4 provided thereupon. The electrode films 3 correspond to the electrode films 150, 154, 158, and 162 illustrated in FIG. 2. The insulating films 2 correspond to the silicon oxide films 148, 152, 156, 160, and 164 illustrated in FIG. 2. The first inter-layer silicon oxide film 4 corresponds to the BPSG film 182 illustrated in FIG. 2. Although the first layer 51 may include components other than the stacked structural unit recited above, a description is omitted herein.

The ONO film 172 of a silicon oxide film, a silicon nitride film, and a silicon oxide film forming a charge storage layer is formed on the side wall of the first hole 61 passing through the first layer 51. Silicon is filled into the interior of the first hole 61 to form the semiconductor pillar 193. Thereby, a memory cell having a storage unit of the ONO film 172 of the charge storage layer is formed at the intersection between the semiconductor pillar 193 and each of the electrode films 3. In other words, the first layer 51 is a memory unit having memory cells formed on the semiconductor pillar 193 aligned in the direction perpendicular to the major surface of the substrate 1.

In the second layer 52 provided on the first layer 51, for example, selection gate transistors for selecting the memory cells and interconnects connected thereto are formed. In this specific example, the second layer 52 is provided on the first major surface 51a of the first layer 51 and includes a second inter-layer silicon oxide film 9, a polysilicon layer 10 forming selection gate lines provided thereupon, and a silicon oxide film 11 provided thereupon. The second inter-layer silicon oxide film 9, the polysilicon layer 10, and the silicon oxide film 11 correspond to the silicon oxide film 183, the polysilicon film 184, and the insulating film 185 illustrated in FIG. 2, respectively. In FIG. 3, the gate insulating film (the thermal oxide film 189 illustrated in FIG. 2) of the selection gate transistor and the like are omitted.

In other words, in this specific example, the same material is used as the first column 61a and the second column 62a; and the columnar structural unit 60 is the semiconductor pillar 193 provided in the interiors of the first hole 61 made in the first layer 51 and the second hole 62 made in the second layer 52.

In the semiconductor device 100b, the side portion 80 is further provided on at least a portion of the side wall of the columnar structural unit 60 on the second layer 52 side of the first major surface 51a.

The semiconductor device 100b having such a structure is constructed, for example, as follows.

FIGS. 4A to 4D are schematic cross-sectional views in order of the steps, illustrating a method for manufacturing the semiconductor device according to the first example of the invention.

Figure 4A:
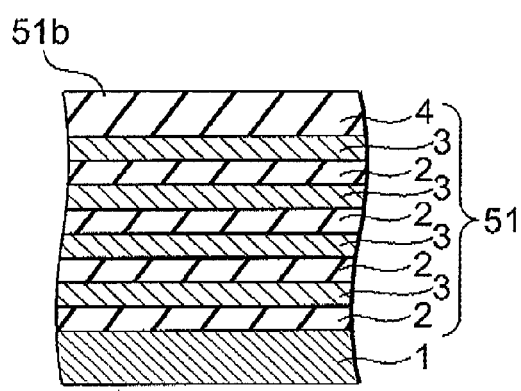
FIGS. 4A to 4D are schematic cross-sectional views in order of the steps, illustrating a method for manufacturing the semiconductor device according to the first example of the invention.
Figure 4B:
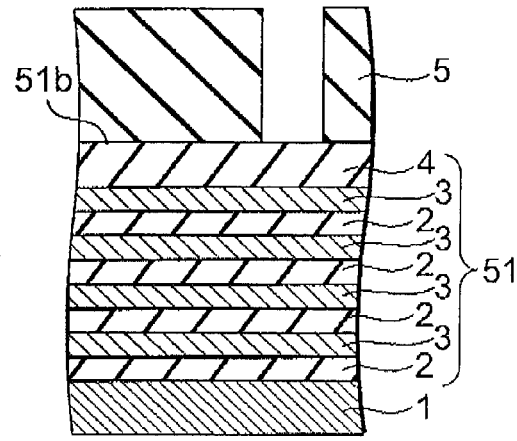
Figure 4C:
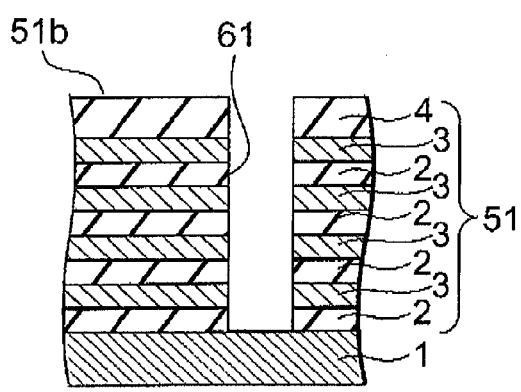
Figure 4D:
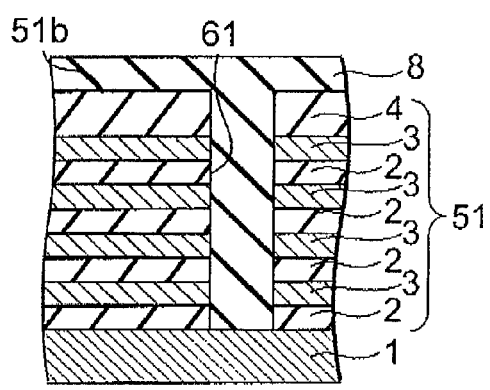

Namely, FIG. 4A illustrates the initial step. FIGS. 4B, 4C, and 4D each illustrate the step continuing from the respective prior step.

FIGS. 5A to 5D are schematic cross-sectional views in order of the steps, continuing from FIG. 4D.

Figure 5A:
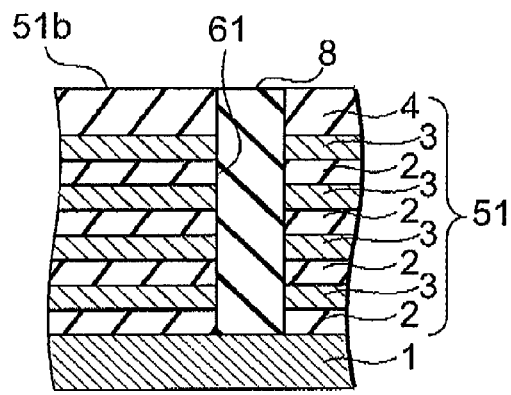
FIGS. 5A to 5D are schematic cross-sectional views in order of the steps, continuing from FIG. 4D.
Figure 5B:
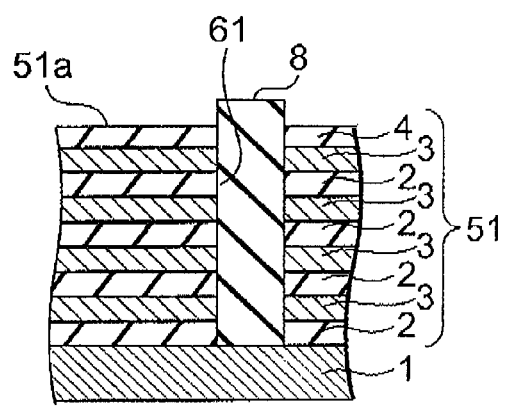
Figure 5C:
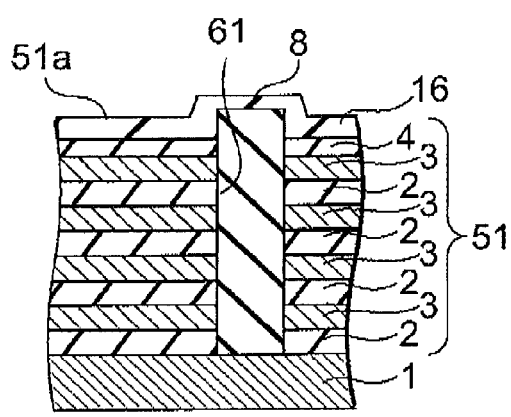
Figure 5D:
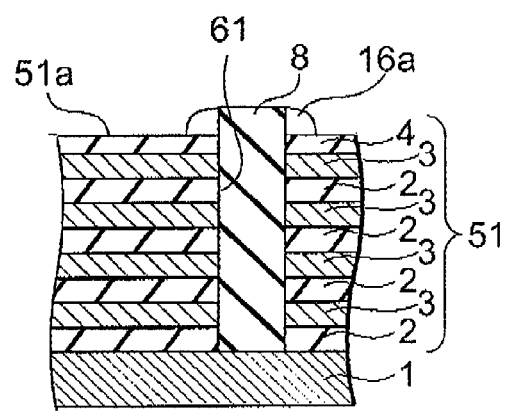

FIGS. 6A to 6D are schematic cross-sectional views in order of the steps, continuing from FIG. 5D.

FIGS. 7A to 7C are schematic cross-sectional views in order of the steps, continuing from FIG. 6D.

As illustrated in FIG. 4A, the insulating films 2 made of silicon oxide are deposited alternately in four layers with the electrode films 3 made of polysilicon on the substrate 1 and the first inter-layer silicon oxide film 4 is deposited thereupon using, for example, CVD (Chemical Vapor Deposition). Although omitted here, various interconnects and plugs may be provided on the substrate 1 as illustrated in FIG. 2. The insulating films 2, the electrode films 3, and the first inter-layer silicon oxide film 4 form the first layer 51. In this specific example, the surface of the first inter-layer silicon oxide film 4 is a second major surface 51b. In other words, as described below, etching is performed on the second major surface 51b, i.e., the surface of the first inter-layer silicon oxide film 4, and the first major surface 51a is formed as a result.

Then, as illustrated in FIG. 4B, a resist 5 is provided on the second major surface 51b, i.e., the surface of the first inter-layer silicon oxide film 4. A first hole pattern forming the memory cells is made in the resist 5 by lithography.

Continuing as illustrated in FIG. 4C, the first inter-layer silicon oxide film 4 and the insulating films 2 stacked with the electrode films 3 are progressively patterned using, for example, dry etching. Then, the resist 5 is removed using ashing and wet cleaning. Thereby, the first hole 61 is made.

Then, as illustrated in FIG. 4D, a silicon nitride film 8 is filled into the first hole 61 using, for example, CVD.

Continuing as illustrated in FIG. 5A, the silicon nitride film 8 on the upper face of the first inter-layer silicon oxide film 4 is removed by, for example, hot phosphoric acid treatment while leaving the silicon nitride film 8 in the interior of the first hole 61.

Then, as illustrated in FIG. 5B, a portion of the first inter-layer silicon oxide film 4 is selectively removed with respect to the silicon nitride film 8 by, for example, dilute hydrofluoric acid treatment. In other words, the second major surface 51b, i.e., the surface of the first inter-layer silicon oxide film 4, is caused to recede to form the first major surface 51a of the first layer 51 while leaving the silicon nitride film 8.

Continuing as illustrated in FIG. 5C, a silicon nitride film 16 is deposited on the first inter-layer silicon oxide film 4 and the silicon nitride film 8 by, for example, CVD.

Then, as illustrated in FIG. 5D, dry etching using, for example, $CH_3F$ gas is used to pattern the silicon nitride film 16 with a selectivity with respect to the first inter-layer silicon oxide film 4. A silicon nitride film 16a is left on the side face of the silicon nitride film 8, and the silicon nitride film 16 on the upper face of the first inter-layer silicon oxide film 4 excluding the side face of the silicon nitride film 8 is removed.

Continuing as illustrated in FIG. 6A, the second inter-layer silicon oxide film 9 is deposited using, for example, CVD.

Then, as illustrated in FIG. 6B, the difference in levels occurring on the silicon nitride film 8 is removed as necessary by CMP (Chemical Mechanical Polishing) to planarize.

Continuing as illustrated in FIG. 6C, the polysilicon layer 10 forming selection gates and the silicon oxide film 11 forming a hard mask are deposited using, for example, CVD. A resist 12 is subsequently provided thereupon. A second hole pattern is made in the resist 12 using lithography. The second inter-layer silicon oxide film 9, the polysilicon layer 10, and the silicon oxide film 11 form the second layer 52.

Then, as illustrated in FIG. 6D, the second hole pattern of the resist 12 is transferred to the silicon oxide film 11, the silicon oxide film 11 is patterned, and the resist 12 is subsequently removed using dry etching, ashing, and wet cleaning.

Continuing as illustrated in FIG. 7A, the polysilicon layer 10 and the second inter-layer silicon oxide film 9 are patterned using the silicon oxide film 11 as a hard mask, the silicon nitride film 8 filled into the first hole 61 is exposed, and the second hole 62 thereby reaches the silicon nitride film 16a. Thus, the first hole 61 and the second hole 62 are linked. Although the positions of the first hole 61 and the second hole 62 may be shifted from each other due to the lithography alignment shift at this time, the second inter-layer silicon oxide film 9 has etching selectivity with the silicon nitride film 16a and the silicon nitride film 16a acts as an etching stopper. The first inter-layer silicon oxide film 4 can be left without being etched.

Then, as illustrated in FIG. 7B, the silicon nitride film 8 and the silicon nitride film 16a are removed by, for example, hot phosphoric acid treatment.

Continuing as illustrated in FIG. 7C, an ONO film 13 of a silicon oxide film, a silicon nitride film, and a silicon oxide film forming a charge storage layer is deposited on the side walls of the first hole 61 and the second hole 62, and a polysilicon layer 14 is filled therein. Thereby, memory cells having a MONOS (Metal Oxide Nitride Oxide Semiconductor) structure is formed of the electrode films 3, the ONO film 13, and the polysilicon layer 14. The polysilicon layer 14 forms the semiconductor pillar 193, that is, the columnar structural unit 60.

Then, unnecessary portions of the ONO film 13 and the polysilicon layer 14 are removed as necessary, and the semiconductor device 100b illustrated in FIG. 3 is constructed.

In the semiconductor device 100b of the first example, the side portion 80 is the ONO film 172 filled into the location where the silicon nitride film 16a formed on the side face of the semiconductor pillar 193 (the columnar structural unit 60) existed. The ONO film 172 of the side portion 80 may be considered to be a portion of a protruding portion of the columnar structural unit 60. In other words, the protruding portion of the columnar structural unit 60 may include at least a portion of at least one selected from the first silicon oxide film, the second silicon oxide film, and the silicon nitride film provided between the first silicon oxide film and the second silicon oxide film of the ONO film forming the charge storage layer.

However, depending on the size of the silicon nitride film 16a, polysilicon of the semiconductor pillar 193 may be filled into the location where the silicon nitride film 16a existed in addition to the ONO film 172 in the step illustrated in FIG. 7B. In such a case, the side portion 80 (the ONO film 172) is provided in the location where the silicon nitride film 16a existed, and further, the semiconductor pillar 193 has a structure including a protruding portion protruding toward the location where the silicon nitride film 16a existed.

Thus, in the case where the location where the silicon nitride film 16a existed is large, the columnar structural unit 60 (the semiconductor pillar 193) passes through at least a portion of the first layer 51 and at least a portion of the second layer 52 to align in the direction orthogonal to the first major surface 51a and includes a protruding portion protruding in the direction orthogonal to the alignment direction on the second layer 52 side of the first major surface 51a. In such a case as well, the columnar structural unit 60 is conductive.

In the case of such a structure, it may be considered that the semiconductor pillar 193 does not have a protruding portion, but it may be considered that the ONO film 172 and polysilicon are filled into the location where the silicon nitride film 16a existed and the side portion 80 may be the ONO film 172 and the polysilicon.

In the semiconductor device 100b, the electrode film 3 below the first inter-layer silicon oxide film 4 is not damaged because the silicon nitride film 16a performs the role of an etching stopper and the first inter-layer silicon oxide film 4 is not etched when making the second hole 62 in the second layer 52 in the step illustrated in FIG. 7A as described above.

In other words, the first inter-layer silicon oxide film 4 remains and the ONO film 172 is not formed on the upper face of the electrode film 3 below the first inter-layer silicon oxide film 4. Therefore, the ONO film 172 contacts the electrode films 3 only at the side faces of the electrode films 3; the upper face of the uppermost electrode film 3 is covered by the first inter-layer silicon oxide film 4; and the upper face of the uppermost electrode film 3 does not directly contact the ONO film 172. Therefore, the surface area of the uppermost electrode film 3 opposing the ONO film 172 can be the same as those of the electrode films 3 of the lower layers, the device characteristics are uniform, and stable memory operations can be realized.

Thus, the semiconductor device 100b according to this example has a higher tolerance of lithography alignment shift during the formation of the columnar structural unit 60 and suppresses deterioration of the device characteristics.

First Comparative Example

Figure 8:
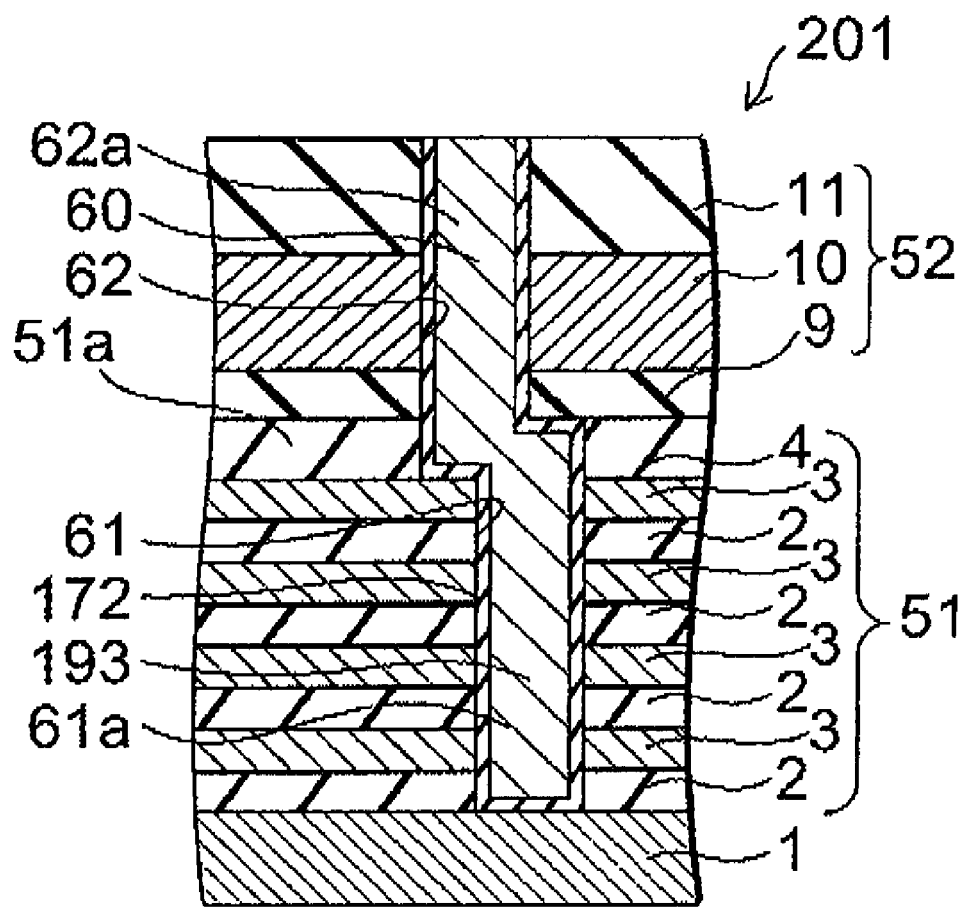
FIG. 8 is a schematic cross-sectional view illustrating the configuration of a semiconductor device of a first comparative example.

FIG. 8 is a schematic cross-sectional view illustrating the configuration of a semiconductor device of a first comparative example.

As illustrated in FIG. 8, the side portion 80 is not provided in a semiconductor device 201 of the first comparative example. Therefore, the first inter-layer silicon oxide film 4 is etched and the electrode film 3 therebelow is exposed when making the second hole 62. Therefore, the upper face of the uppermost electrode film 3 contacts the ONO film 172, and the surface area of the electrode film 3 opposing the ONO film 172 for the uppermost electrode film 3 is different from the electrode films 3 of the lower layers.

The semiconductor device 201 of the first comparative example is constructed as follows.

FIGS. 9A to 9D are schematic cross-sectional views in order of the steps, illustrating a method for manufacturing the semiconductor device of the first comparative example. FIG. 10 is a schematic cross-sectional view in order of the steps, continuing from FIG. 9D.

In the semiconductor device 201 of the first comparative example, similarly to the semiconductor device 100b, the insulating films 2 and the electrode films 3 are alternately deposited in multiple layers on the substrate 1 and then the first inter-layer silicon oxide film 4 is deposited to form the first layer 51. The first hole 61 is made in the first layer 51. The silicon nitride film 8 is filled into the first hole 61, and the silicon nitride film 8 on the upper face of the first inter-layer silicon oxide film 4 is removed by wet etching.

Figure 9A:
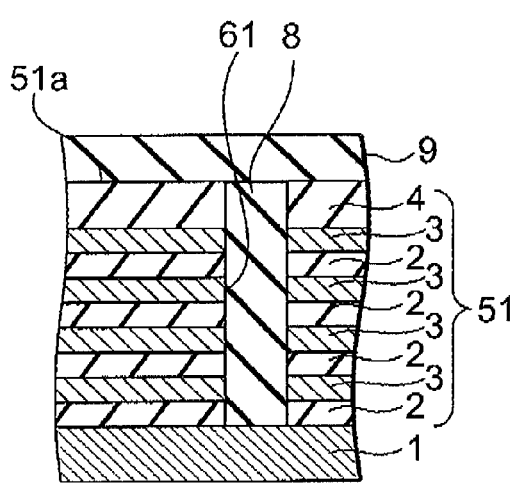
FIGS. 9A to 9D are schematic cross-sectional views in order of the steps, illustrating a method for manufacturing the semiconductor device of the first comparative example.
Figure 10:
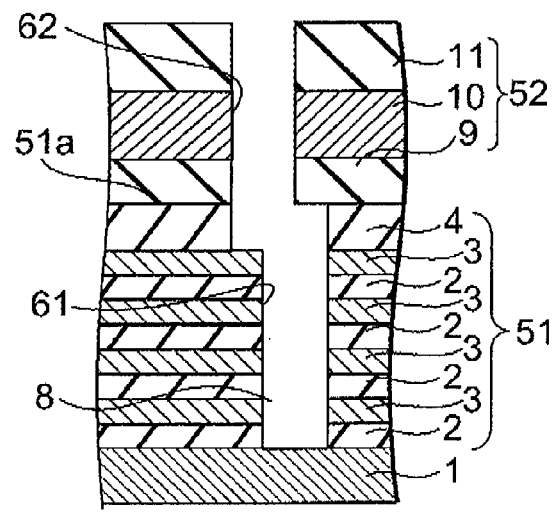
FIG. 10 is a schematic cross-sectional view in order of the steps, continuing from FIG. 9D.

Then, in the case of the semiconductor device 201 of the first comparative example, the second inter-layer silicon oxide film 9 is deposited on the first major surface 51a of the first layer 51 as illustrated in FIG. 9A.

Figure 9B:
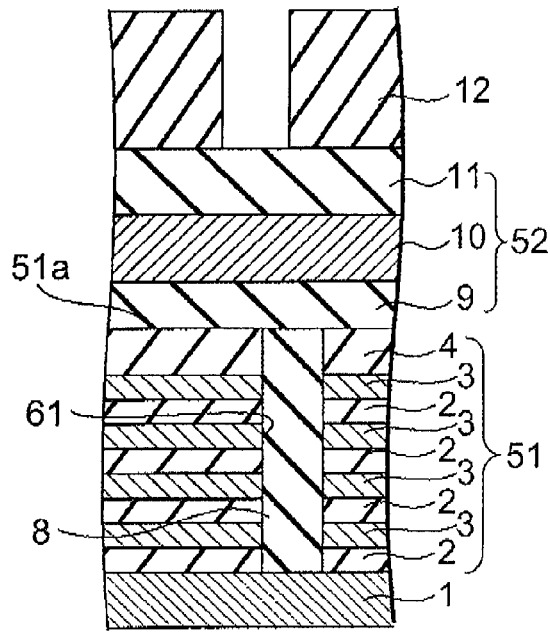

Continuing as illustrated in FIG. 9B, the polysilicon layer 10 forming selection gates and the silicon oxide film 11 forming a hard mask are deposited. The second hole pattern is made in the resist 12 using lithography. In such a case as well, the second inter-layer silicon oxide film 9, the polysilicon layer 10, and the silicon oxide film 11 form the second layer 52.

Figure 9C:
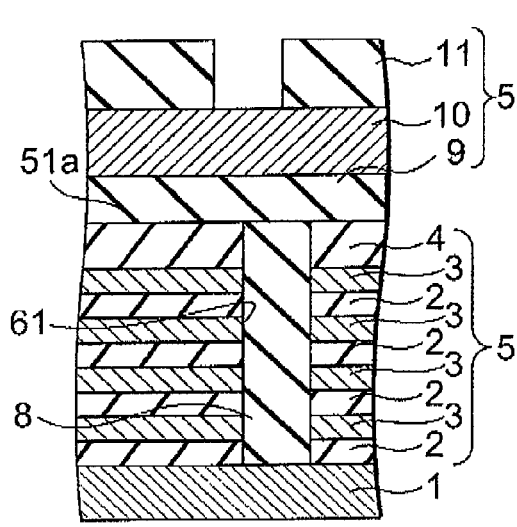

Then, as illustrated in FIG. 9C, the second hole pattern of the resist 12 is transferred onto the silicon oxide film 11 using dry etching, ashing, and wet cleaning.

Figure 9D:
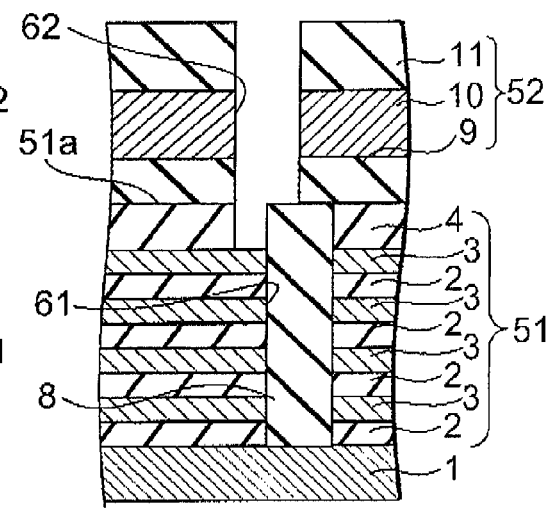

Continuing as illustrated in FIG. 9D, the polysilicon layer 10 and the second inter-layer silicon oxide film 9 are patterned using the silicon oxide film 11 as a hard mask to make the second hole 62. By exposing the silicon nitride film 8 filled into the first hole 61, the first hole 61 and the second hole 62 are linked.

At this time, the positions of the first hole 61 and the second hole 62 are shifted due to the alignment shift of lithography. It is impossible to completely eliminate such shifting. Therefore, a portion of the second hole 62 overhangs the first hole 61. Here, when performing dry etching of the polysilicon layer 10 and the second inter-layer silicon oxide film 9, over-etching is performed considering fluctuations of etching rates within the wafer surface and fluctuations of the deposited films such as the polysilicon layer 10 and the second inter-layer silicon oxide film 9 among wafers. At such a time, because there is no etching selectivity between the first inter-layer silicon oxide film 4 and the second inter-layer silicon oxide film 9, the first inter-layer silicon oxide film 4 is etched as illustrated in FIG. 9D, and the uppermost electrode film 3 of the first layer 51 is exposed.

Then, the silicon nitride film 8 is subsequently removed as illustrated in FIG. 10.

Continuing, the ONO film 13 of the silicon oxide film, the silicon nitride film, and the silicon oxide film forming the charge storage layer is deposited on the side wall of the first hole 61. The polysilicon layer 14 is filled therein. The unnecessary ONO film 13 and polysilicon layer 14 are removed as necessary, and the semiconductor device 201 of the first comparative example illustrated in FIG. 8 is formed.

Because the ONO film 13 is formed also on the upper face of the uppermost electrode film 3 of the first layer 51 in the semiconductor device 201 of the first comparative example thus constructed as described above in regard to FIG. 8, the surface area of the memory cell of the uppermost word line (the electrode film 3) is different from the surface area of the memory cells of the other word lines (the electrode films 3), and the characteristics of the uppermost memory cell are different from those of the other layers. Thereby, the device characteristics of the nonvolatile memory device deteriorate, and the yield decreases.

Thus, because an etching stopper is not provided at the first major surface 51a of the first layer 51 of the semiconductor device 201 of the first comparative example when making the second hole 62 of the second layer 52, the first inter-layer silicon oxide film 4 also is etched, the uppermost electrode film 3 of the first layer 51 is exposed, and characteristics deteriorate.

Conversely, in the semiconductor device 100b according to the first example described above, the silicon nitride film 16a forming the side portion 80 is provided at the first major surface 51a of the upper portion of the first hole 61 of the first layer 51. The silicon nitride film 16a functions as an etching stopper when making the second hole 62 in the second layer 52. Therefore, the first inter-layer silicon oxide film 4 is not etched even in the case where over-etching is performed. Thereby, the uppermost electrode film 3 of the first layer 51 is protected, and the formation of the ONO film 172 on the upper face of the uppermost electrode film 3 of the first layer 51 can be prevented. Thereby, the device characteristics are stabilized, and the yield can be prevented from decreasing.

Second and Third Comparative Examples

Figures 11A, 11B:
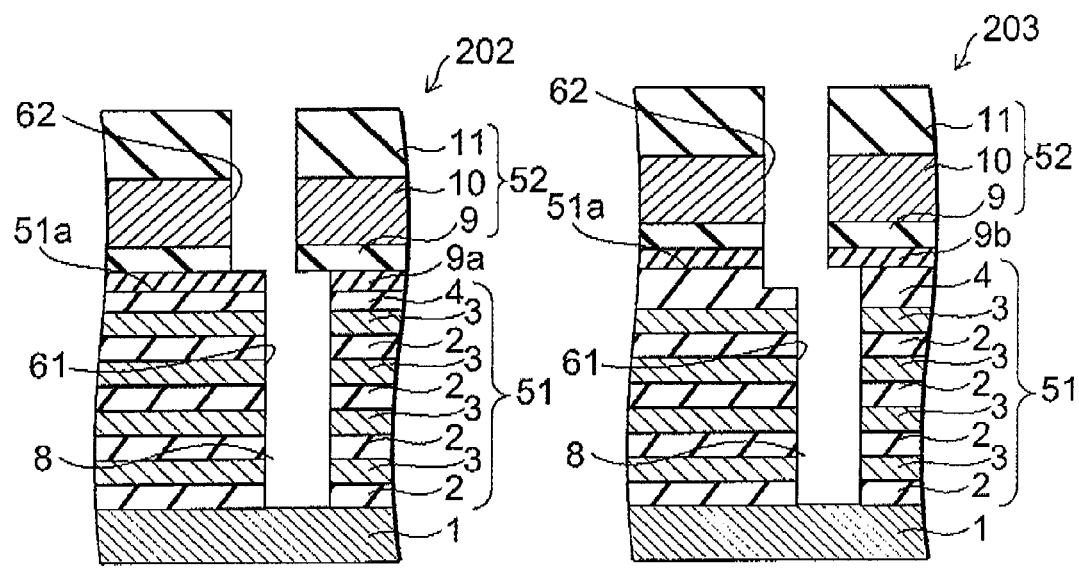
FIGS. 11A and 11B are schematic cross-sectional views illustrating states partway through manufacturing semiconductor devices of second and third comparative examples.

FIGS. 11A and 11B are schematic cross-sectional views illustrating states partway through manufacturing semiconductor devices of second and third comparative examples.

Namely, FIGS. 11A and 11B illustrate the states illustrated in FIG. 10 where the silicon nitride film 8 is removed and the first hole 61 and the second hole 62 communicate with each other. In other words, FIGS. 11A and 11B correspond to FIG. 7B according to the first example.

In a semiconductor device 202 of the second comparative example illustrated in FIG. 11A, an etching stopper film 9a made of a silicon nitride film is provided on the first inter-layer silicon oxide film 4 in the first layer 51. The first hole 61 is made in the first layer 51, the silicon nitride film 8 is filled therein, the second layer 52 made of the second inter-layer silicon oxide film 9, the polysilicon layer 10, and the silicon oxide film 11 is subsequently deposited on the first major surface 51a, and the second hole 62 is made. At this time, when making the second hole 62, the first inter-layer silicon oxide film 4 is protected by the etching stopper film 9a. As a result, the upper face of the uppermost electrode film 3 therebelow is prevented from being exposed. Thereby, the phenomenon of the memory cell of the uppermost electrode film 3 having a different surface area than the other memory cells can be suppressed.

However, in the case of the semiconductor device 202 of the second comparative example, the etching stopper film 9a is provided on the entire surface of the upper face of the first layer 51. Therefore, the process compatibility deteriorates when patterning other portions of the semiconductor device 202. In other words, for example, although the electrode films 150, 154, 158, and 162 are connected to the connection plugs 188d, 188e, 188f, and 188g as illustrated in FIG. 2, the etching stopper film 9a is formed above the electrode films 150, 154, 158, and 162. Therefore, the process of forming the connection portions becomes complex and is not realistic.

Conversely, in the semiconductor device 100b according to the first example, the silicon nitride film 16a (the film of the portion forming the side portion 80) functions as an etching stopper and is provided partially and selectively on the side face of the first hole 61 and not on the entire surface of the upper face of the first layer 51. Therefore, the process compatibility problems recited above do not occur.

On the other hand, in a semiconductor device 203 of a third comparative example illustrated in FIG. 11B, an etching stopper film 9b is formed on the first major surface 51a after the silicon nitride film 8 is filled into the first hole 61 made in the first layer 51. The second inter-layer silicon oxide film 9, the polysilicon layer 10, and the silicon oxide film 11 are deposited on the etching stopper film 9b, and the second hole 62 is made. At this time, the second hole 62 is made to pass through the etching stopper film 9b. Therefore, the first inter-layer silicon oxide film 4 is not protected, and as a result, there is still a risk that the upper face of the uppermost electrode film 3 therebelow will be exposed. Therefore, there is a risk that the surface area of the memory cell of the uppermost electrode film 3 will be different, and the device characteristics of the nonvolatile memory device will deteriorate or the yield will decrease.

Thus, the semiconductor device 100b according to this example has a higher tolerance of lithography alignment shift during the formation of the columnar structural unit 60 and suppresses deterioration of the device characteristics without deterioration of the process compatibility.

Figures 12A, 12B:
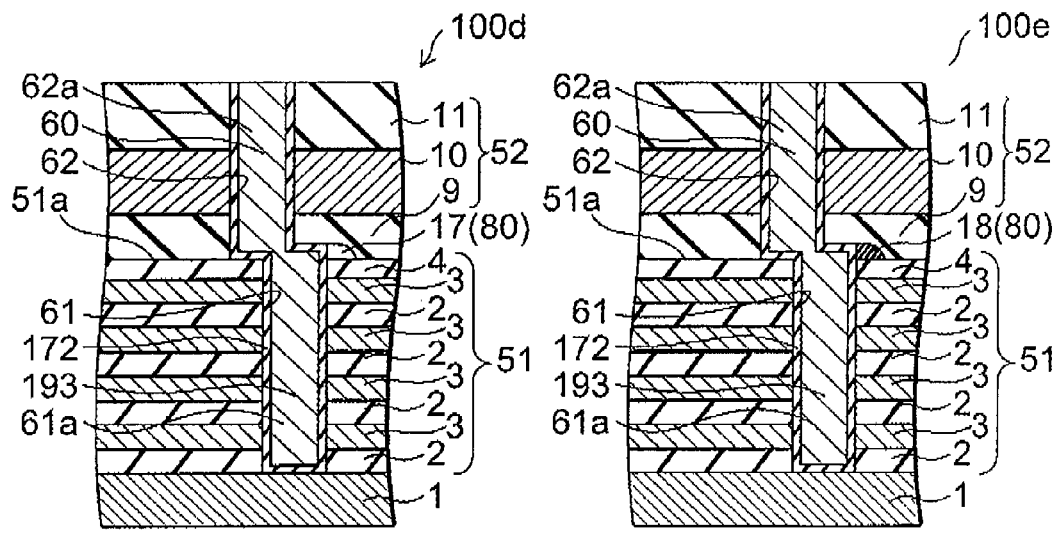
FIGS. 12A and 12B are schematic cross-sectional views illustrating configurations of other semiconductor devices according to the first embodiment of the invention.

FIGS. 12A and 12B are schematic cross-sectional views illustrating configurations of other semiconductor devices according to the first embodiment of the invention.

In another semiconductor device 100d according to this embodiment illustrated in FIG. 12A, a void 17 is provided in the location where the silicon nitride film 16a initially existed. In other words, although the ONO film 13 (and the polysilicon layer 14) is filled into the location where the silicon nitride film 16a existed in the semiconductor device 100b according to the first example, in the semiconductor device 100d, the location is the void 17. The void 17 forms the side portion 80. Thus, device characteristic problems do not occur even in the case where the location where the silicon nitride film 16a existed is the void 17.

Thus, although the location where the silicon nitride film 16a existed forms the side portion 80, a insulating material such as the ONO film 13 or a conductive material such as the polysilicon layer 14 may be filled into the side portion 80, and the side portion 80 may include the void 17.

In another semiconductor device 100e according to this embodiment illustrated in FIG. 12B, an insulating layer 18 made of, for example, silicon carbide or aluminum oxide is provided in the location where the silicon nitride film 16a is provided in the semiconductor device 100b. The insulating layer 18 functions as an etching stopper to protect the first layer 51 when making the second hole 62.

In such a case, the insulating layer 18 formed on the side wall at the upper portion of the first hole 61 remains after making the second hole 62, that is, after depositing, for example, the ONO film 13. Then, the side portion 80 forms the insulating layer 18. Thus, the insulating layer 18 which functions as the etching stopper may remain.

However, although the semiconductor device 100b is an example in which the first layer 51 includes the stacked unit of the multiple insulating films 2 alternately stacked with the multiple electrode films 3, the invention is not limited thereto. In other words, at least one selected from the first layer 51 and the second layer 52 may include the stacked unit of the multiple insulating films 2 alternately stacked with the multiple electrode films 3. In such a case, the number of each of the stacked insulating films 2 and electrode films 3 may be four or more. Thereby, the bit density can be improved.

Second Example

A second example is an example in which this embodiment is applied to the contact portion C2 of the semiconductor device 100 illustrated in FIG. 2.

Figure 13:
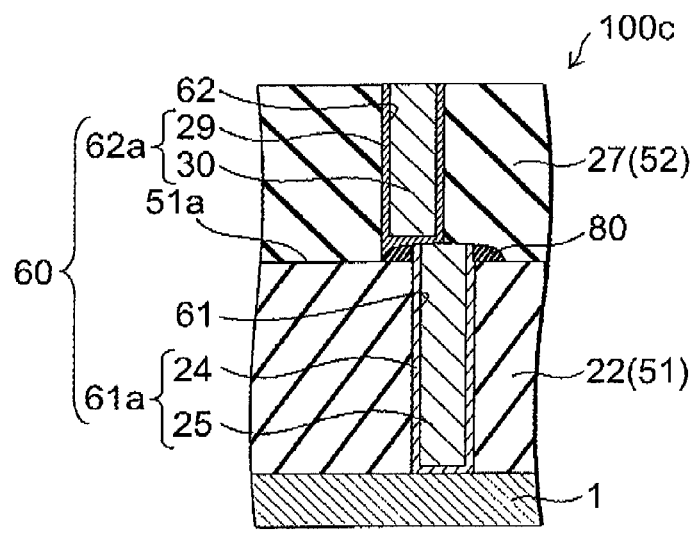
FIG. 13 is a schematic cross-sectional view illustrating the configuration of main components of a semiconductor device according to a second example of the invention.

FIG. 13 is a schematic cross-sectional view illustrating the configuration of main components of a semiconductor device according to the second example of the invention.

As illustrated in FIG. 13, a semiconductor device 100c according to this example includes the substrate 1, the first layer 51 provided on the substrate 1, the second layer 52 provided on the first major surface 51a (the major surface) of the first layer 51 on the side opposite to the substrate 1, and a columnar structural unit 60 aligned in the first layer 51 and the second layer 52 to pass through the first major surface 51a. The columnar structural unit 60 is conductive.

The first layer 51 corresponds to the silicon oxide film 142 and the silicon oxide film 148 illustrated in FIG. 2. The second layer 52 corresponds to the BPSG film 182 and the silicon oxide film 187 illustrated in FIG. 2.

The columnar structural unit 60 includes the first column 61a filled into the first hole 61 made in the first layer 51 and the second column 62a filled into the second hole 62 made in the second layer 52. The first column 61a and the second column 62a correspond to the connection plug 188h and the connection plug 188i (the second column 62a) illustrated in FIG. 2, respectively.

A barrier metal 24 and a tungsten film 25 are used as the first column 61a. A Cu film 30 and a stacked film 29 formed of a barrier metal such as TaN and a seed Cu film are used as the second column 62a. Thus, in this specific example, the columnar structural unit 60 is formed of the first column 61a and the second column 62a which are formed of mutually different materials.

The semiconductor device 100c further includes the side portion 80 added to the side wall of the columnar structural unit 60 on the second layer 52 side of the first major surface 51a of the first layer 51. The side portion 80 is provided on at least a portion of the side wall of the columnar structural unit 60. Specifically, the side portion 80 is provided on the side face of the first column 61a on the second layer 52 side of the first major surface 51a of the first layer 51. Although insulating materials such as, for example, silicon nitride, silicon carbide, and aluminum oxide and various conductive materials may be used as the side portion 80, in this specific example, silicon nitride is used as the side portion 80 to form an etching stopper during the process of making the second hole 62.

Thus, in the semiconductor device 100c having such a configuration, the side portion 80 functions as an etching stopper when making the second column 62a of the columnar structural unit 60. Therefore, the first layer 51 is not damaged. In other words, although the electrical characteristics deteriorate in the case where the first layer 51 is damaged, the side portion 80 prevents such deterioration of the device characteristics. Thereby, a semiconductor device can be provided having a higher tolerance of lithography alignment shift and suppressed deterioration of the device characteristics.

The semiconductor device 100c may be manufactured, for example, as follows.

FIGS. 14A to 14D are schematic cross-sectional views in order of the steps, illustrating a method for manufacturing the semiconductor device according to the second example of the invention.

FIGS. 15A to 15D are schematic cross-sectional views in order of the steps, continuing from FIG. 14D.

As illustrated in FIG. 14A, first, a first silicon oxide film 22 is deposited on the substrate 1 by CVD. A resist 23 is formed thereupon, and the first hole pattern is made in the resist 23 by lithography.

Then, as illustrated in FIG. 14B, dry etching is performed using, for example, a fluorocarbon gas to transfer the first hole pattern from the resist 23 onto the first silicon oxide film 22. The resist 23 is removed using ashing and wet cleaning. Thereby, the first hole 61 is made.

Continuing as illustrated in FIG. 14C, a barrier metal 24 made of a stacked film of Ti/TiN is deposited on the interior of the first hole 61 by sputtering. A tungsten film 25 is then filled using CVD, after which the barrier metal 24 and the tungsten film 25 are removed from the upper face of the first silicon oxide film 22 using CMP. Thereby, the first column 61a is formed to form a portion of the columnar structural unit 60. Namely, in this specific example, the barrier metal 24 and the tungsten film 25 form the first column 61a.

Then, as illustrated in FIG. 14D, the second major surface 51b of the first silicon oxide film 22 is etched back to form the first major surface 51a by, for example, dry etching using a fluorocarbon gas. Subsequently, a silicon nitride film 26 is deposited on the first silicon oxide film 22 and on the barrier metal 24 and the tungsten film 25 filled into the first hole 61.

Figure 15A:
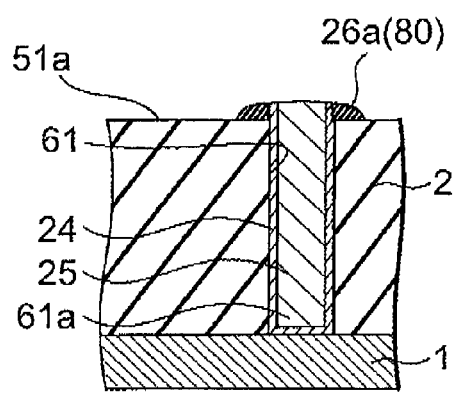
FIGS. 15A to 15D are schematic cross-sectional views in order of the steps, continuing from FIG. 14D.

Continuing as illustrated in FIG. 15A, the surface of the silicon nitride film 26 is etched back by, for example, dry etching to leave the silicon nitride film 26a only on the side wall of the first column 61a at the first major surface 51a. The silicon nitride film 26a forms the side portion 80.

Then, as illustrated in FIG. 156, a second silicon oxide film 27 is deposited on the first silicon oxide film 22, the silicon nitride film 26a, and the barrier metal 24 and the tungsten film 25 filled into the first hole 61 using, for example, CVD. A resist 28 is formed thereupon, and the second hole pattern is made in the resist 28 using lithography.

Figure 15B:
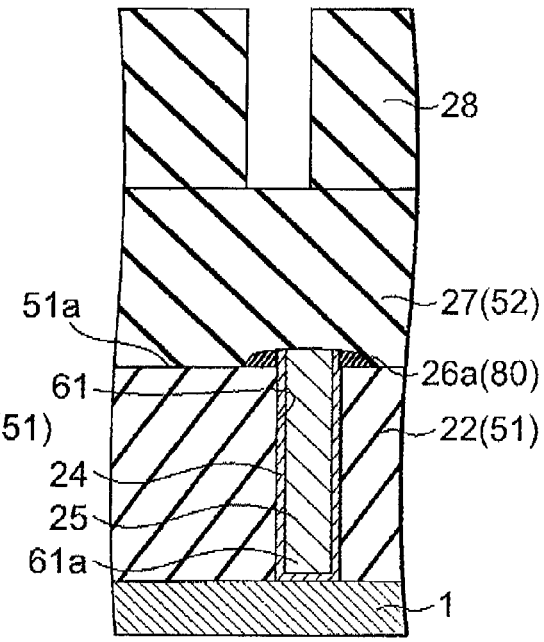
Figure 15C:
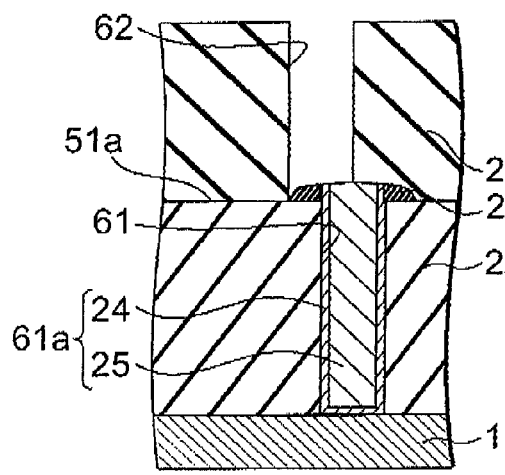

Continuing as illustrated in FIG. 15C, the second hole pattern is transferred onto the second silicon oxide film 27 by dry etching. At this time, the silicon nitride film 26a is provided on the side wall of the first column 61a. Therefore, the etching does not reach the first silicon oxide film 22 even in the case where alignment shift occurs. Thus, the second hole 62 is made.

Figure 15D:
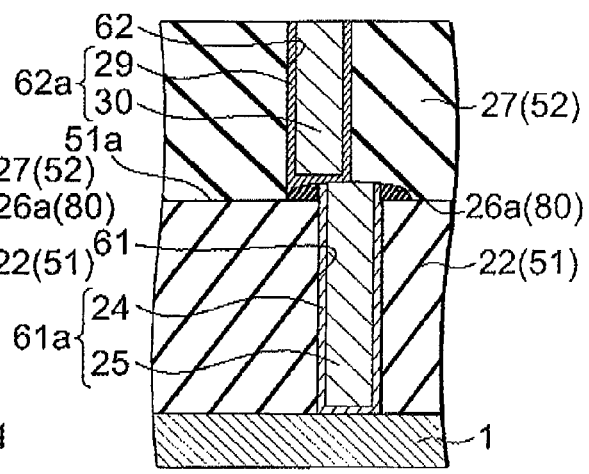

Then, as illustrated in FIG. 15D, the second column 62a forming a Cu plug is formed by forming the stacked film 29 formed of a barrier metal such as, for example, TaN and a seed Cu film in the interior of the second hole 62 by, for example, sputtering; subsequently filling the Cu film 30 thereinto by, for example, plating; and removing the stacked film 29 and the Cu film 30 from the upper face of the second silicon oxide film 27 by CMP. The stacked film 29 and the Cu film 30 form the second column 62a, and the first column 61a and the second column 62a form the columnar structural unit 60.

Thus, the semiconductor device 100c according to the second example illustrated in FIG. 13 is constructed.

Fourth Comparative Example

Figure 16:
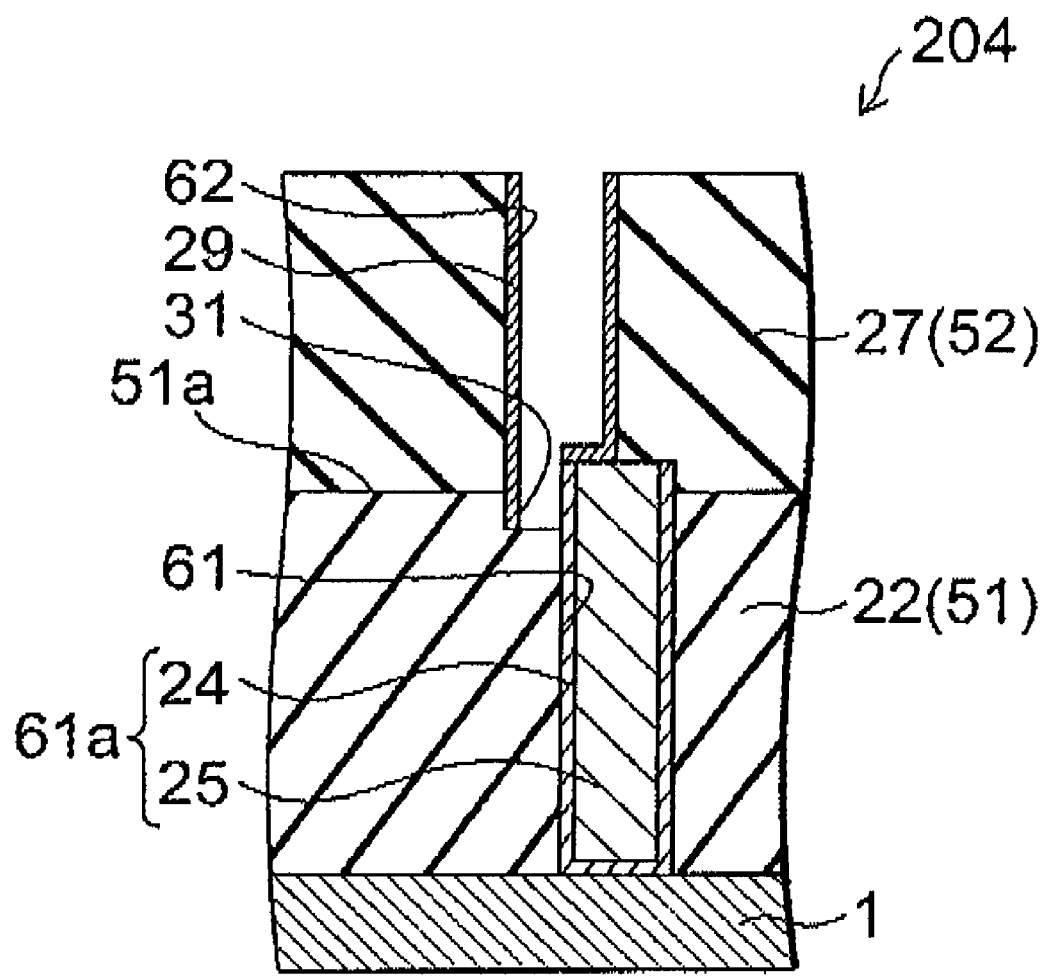
FIG. 16 is a schematic cross-sectional view illustrating a state partway through the manufacturing of a semiconductor device of a fourth comparative example.

FIG. 16 is a schematic cross-sectional view illustrating a state partway through the manufacturing of a semiconductor device of a fourth comparative example.

Namely, FIG. 16 illustrates the state where the second hole 62 has been made and the stacked film 29 formed of the barrier metal such as TaN and the seed Cu film has been formed in the interior of the second hole 62. In other words, FIG. 16 corresponds to a step partway from FIG. 15C to FIG. 15D according to the second example.

As illustrated in FIG. 16, the side portion 80 (i.e., the silicon nitride film 26a) is not provided in a semiconductor device 204 of the fourth comparative example. Therefore, the first layer 51, i.e., the first silicon oxide film 22, is etched when making the second hole 62. Therefore, a thin slit 31 is made in an etched portion of the first silicon oxide film 22. The stacked film 29 formed of the barrier metal and the seed Cu film is not deposited on, for example, the bottom face portion of the slit 31, and the first silicon oxide film 22 is in an exposed state. In such a case, serious problems occur such as open defects due to filling defects of Cu and device characteristic deterioration due to diffusion of Cu into the insulating film.

Conversely, in the semiconductor device 100c according to the second example described above, the side portion 80 made of the silicon nitride film 26a is provided; the side portion 80 functions as an etching stopper when making the second column 62a of the columnar structural unit 60; and therefore, damage of the first layer 51 (the first silicon oxide film 22) does not occur. Thereby, good device characteristics can be obtained without making the slit 31. Thus, the semiconductor device 100c has a higher tolerance of lithography alignment shift and suppresses deterioration of the device characteristics.

In the semiconductor device 100c according to this example, a barrier metal material such as TiN or TaN may be used instead of the silicon nitride film 26a. In such a case as well, a semiconductor device can be provided having a higher tolerance of lithography alignment shift and suppressed deterioration of the device characteristics.

Second Embodiment

A method for manufacturing a semiconductor device according to a second embodiment of the invention is a method for manufacturing a semiconductor device including the first layer 51, the second layer 52 provided on the major surface of the first layer 51, and the columnar structural unit 60 aligned in the first layer 51 and the second layer 52 to pass through the major surface of the first layer 51. The columnar structural unit 60 is conductive. The characteristic portions of the method for manufacturing the semiconductor device according to this embodiment will now be described.

Figure 17:
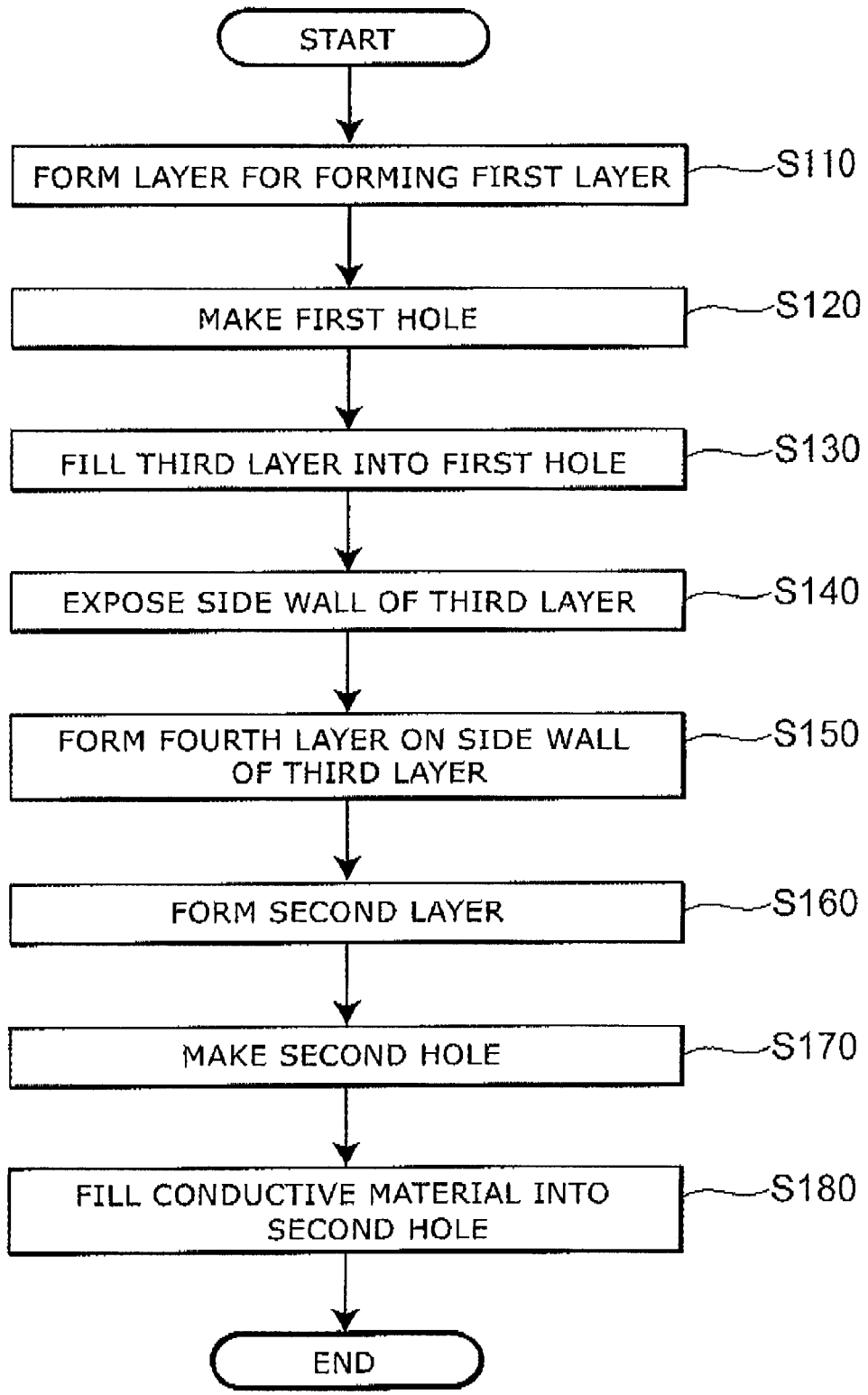
FIG. 17 is a flowchart illustrating the method for manufacturing the semiconductor device according to a second embodiment of the invention.

FIG. 17 is a flowchart illustrating the method for manufacturing the semiconductor device according to the second embodiment of the invention.

In the method for manufacturing the semiconductor device according to the second embodiment of the invention illustrated in FIG. 17, first, a layer for forming the first layer 51 is formed on the substrate 1 (step S110). For example, the methods described in regard to FIG. 4A and FIG. 14A may be used.

Then, the first hole 61 is made aligned in the direction orthogonal to the upper face of the layer for forming the first layer 51 (the second major surface 51b on the side opposite to the substrate 1) from the second major surface 51b toward the substrate 1 side (step S120). Here, the methods described in regard to FIGS. 4B, 4C, and 14B may be used. As described below, the upper face of the layer for forming the first layer 51 (the second major surface 51b) is subsequently etched to form the first major surface 51a (the major surface).

Continuing, a third layer is filled into the interior of the first hole 61 (step S130).

In other words, as described in regard to FIG. 4D, the silicon nitride film 8 is filled into the interior of the first hole 61 as the third layer. Or, as described in regard to FIG. 14C, the barrier metal 24 and the tungsten film 25, i.e., the stacked film of Ti/TiN forming the third layer, are filled into the interior of the first hole 61 to form the first column 61a forming the third layer.

The second major surface of the first layer 51 is caused to recede to expose a side wall of the third layer (step S140).

In other words, for example, as described in regard to FIG. 5B, the second major surface 51b of the first layer 51 is caused to recede to form the first major surface 51a, and the side wall of the silicon nitride film 8, i.e., the third layer, is exposed.

Or, as described in regard to FIG. 14D, the second major surface 51b of the first silicon oxide film 22 is etched back to form the first major surface 51a, and the side wall of the first column 61a, i.e., the third layer, is exposed.

Then, the fourth layer is formed on the side wall of the exposed third layer (step S150).

In other words, for example, as described in regard to FIGS. 5C and 5D, etch-back is performed after forming the silicon nitride film 16, and the silicon nitride film 16a forming the fourth layer is formed on a portion of the side wall of the silicon nitride film 8, i.e., the third layer.

Or, as described in regard to FIG. 14D and FIG. 15A, the silicon nitride film 26 is etched back after depositing the silicon nitride film 26, and thereby the silicon nitride film 26a forming the fourth layer remains only on the side wall of the first column 61a, i.e., the third layer, at the first major surface 51a.

Then, the second layer 52 is formed to cover the first layer 51, the third layer, and the fourth layer (step S160).

In other words, for example, as described in regard to FIGS. 6A to 6C, the second inter-layer silicon oxide film 9, the polysilicon layer 10, and the silicon oxide film 11 forming the second layer 52 are formed.

Or, as described in regard to FIG. 15B, the second silicon oxide film 27 forming the second layer 52 is formed.

Continuing, the second hole 62 is made from the upper face of the second layer 52 (the major surface on the side opposite to the first layer 51) to pass through the second layer 52 to reach the third layer (step S170).

In other words, for example, as described in regard to FIG. 6D and FIG. 7A, the second hole 62 is made in the second inter-layer silicon oxide film 9, the polysilicon layer 10, and the silicon oxide film 11 forming the second layer 52 to reach the third layer (the silicon nitride film 8).

The second hole 62 is made by etching. A portion of the first layer 51 facing to the major surface 51a of the first layer 51 and a portion of the second layer 62 facing to the first surface 51a of the first layer 51 do not have etching selectivity with each other. The portion of the first layer 51 and the portion of the second layer 52 has etching selectivity with the fourth layer (the silicon nitride film 16a). An etching rate of the fourth layer (the silicon nitride film 16a) in the etching of the second hole 62 is less than etching rates of the first layer 51 and the second layer 52 in the etching of the second hole 62. For example, the first inter-layer silicon oxide film 4 is used as the portion of the first layer 51 facing to the major surface 51a of the first layer 51, the second inter-layer silicon oxide film 9 is used as the portion of the second layer 62 facing to the first surface 51a of the first layer 51a, and the silicon nitride film 16a is used for the fourth layer. Thereby the fourth layer functions as an etching stopper when making the second hole 62 in the second layer 52. In this case, for example, the silicon nitride film 8 may be used as the third layer, as shown in FIG. 4D.

Or, as described in regard to FIG. 15C, the second hole 62 is made in the second silicon oxide film 27 forming the second layer 52 to reach the first column 61a forming the third layer.

The second hole 62 is also made by etching. A portion of the first layer 51 facing to the major surface 51a of the first layer 51 (the first silicon oxide film 22) and a portion of the second layer 62 facing to the first surface 51a of the first layer 51 (the second silicon oxide film 27) do not have etching selectivity with each other. The portion of the first layer 51 and the portion of the second layer 52 has etching selectivity with the fourth layer (the silicon nitride film 26a). An etching rate of the fourth layer (the silicon nitride film 26a) in the etching of the second hole 62 is less than etching rates of the first layer 51 and the second layer 52 in the etching of the second hole 62. Thereby the fourth layer (the silicon nitride film 26a) functions as an etching stopper when making the second hole 62 in the second layer 52. In this case, a layer including a metal may be used as the third layer. As the layer including a metal, the barrier metal 24 and the tungsten film 25 may be used, as shown in FIG. 14C, for example.

Then, a conductive material is filled into the interior of the second hole 62 (step S180).

In other words, for example, as described in regard to FIGS. 7B and 7C, after removing the silicon nitride film 8 and the silicon nitride film 16a, the ONO film 13 and the polysilicon layer 14 are filled into the interior of the first hole 61 and the second hole 62.

Or, as described in regard to FIG. 15O, the stacked film 29 and the Cu film 30 are filled into the interior of the second hole 62.

Thus, the semiconductor devices 100b and 100c can be formed.

According to the method for manufacturing the semiconductor device according to this embodiment, the fourth layer is provided on the side wall of the third layer and functions as an etching stopper when making the second hole 62 in the second layer 52. Thereby, the upper face of the first layer 51 is not damaged. Thereby, a method for manufacturing the semiconductor device can be provided having a higher tolerance of lithography alignment shift during the formation of the columnar structural unit 60 and suppressed deterioration of the device characteristics.

The fourth layer recited above may include at least one selected from silicon nitride, silicon carbide, aluminum oxide, titanium nitride and tantalum nitride.

In the method for manufacturing the semiconductor device according to this embodiment, the filling of the conductive material into the interior of the second hole 62 after making the second hole 62 and removing the third layer and the fourth layer may be performed by collectively (continuously) filling a conductive material into the first hole 61 and the second hole 62. In other words, as described in regard to FIGS. 7S and 7C, the ONO film 13 and the polysilicon layer 14 may be filled into the interiors of the first hole 61 and the second hole 62 after removing the silicon nitride film 8 and the silicon nitride film 16a.

Step S110 to step S180 recited above are interchangeable within the extent of technical feasibility and may be implemented simultaneously.

Hereinabove, exemplary embodiments of the invention are described with reference to specific examples. However, the invention is not limited to these specific examples. For example, one skilled in the art may appropriately select specific configurations of components of substrates, semiconductor layers, insulating layers, conductive layers, etc., of semiconductor devices and methods for manufacturing semiconductor devices from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all semiconductor devices and methods for manufacturing semiconductor devices practicable by an appropriate design modification by one skilled in the art based on the semiconductor devices and the methods for manufacturing semiconductor devices described above as exemplary embodiments of the invention also are within the scope of the present invention to the extent that the purport of the invention is included.

Furthermore, various modifications and alterations within the spirit of the invention will be readily apparent to those skilled in the art. All such modifications and alterations should therefore be seen as within the scope of the invention.

The invention claimed is:

1. A semiconductor device, comprising:
   a first layer;
   a second layer provided on a major surface of the first layer;
   a columnar structural unit formed in the first layer and the second layer, the columnar structural unit passing through the major surface and being conductive, the columnar structural unit including:
   a semiconductor layer; and
   a charge storage layer provided between the semiconductor layer and at least one of the first layer or the second layer; and
   a side portion defined by the first layer, the second layer, and the columnar structural unit, the side portion being a void.

2. The device according to claim 1, wherein at least one selected from the first layer and the second layer includes a stacked unit including a plurality of insulating films alternately stacked with a plurality of electrode films.

3. The device according to claim 2, wherein the charge storage layer includes a first silicon oxide film, a second silicon oxide film, and a silicon nitride film provided between the first silicon oxide film and the second silicon oxide film.

4. The device according to claim 1, wherein at least one selected from the first layer and the second layer includes a single layer film or a stacked film, the single layer film including one selected from a semiconductor layer, a conductive layer, and an insulating layer, the stacked film including at least two selected from a semiconductor layer, a conductive layer, and an insulating layer.

5. The device according to claim 1, wherein the columnar structural unit includes a first column provided in the first layer and a second column provided in the second layer, an alignment axis of the first column and an alignment axis of the second column being shifted from each other.

6. The device according to claim 5, wherein at least one selected from the first column and the second column includes at least one selected from copper, aluminum, tungsten, gold, titanium, tantalum, polysilicon doped with an impurity, and amorphous silicon doped with an impurity.

7. The device according to claim 1, wherein the side portion comprises at least one of a single layer film, a stacked film, or a conductive material film, the single layer film including one selected from silicon nitride, silicon carbide, and aluminum oxide, the stacked film including at least two selected from silicon oxide, silicon nitride, and silicon oxide, the conductive material film including at least one selected from polysilicon and amorphous silicon.

8. A semiconductor device, comprising:
   a first layer;
   a second layer provided on a major surface of the first layer; and
   a columnar structural unit formed in the first layer and the second layer, the columnar structural unit passing through the major surface and being conductive, the columnar structural unit including:
   a semiconductor layer; and
   a charge storage layer provided between the semiconductor layer and at least one of the first layer and the second layer, the charge storage layer including a protruding portion on the second layer side of the major surface, the protruding portion protruding in a first direction orthogonal to a second direction along which the column structural unit extends.

9. The device according to claim 8, wherein at least one selected from the first layer and the second layer includes a stacked unit including a plurality of insulating films alternately stacked with a plurality of electrode films.

10. The device according to claim 9, wherein the charge storage layer includes a first silicon oxide film, a second silicon oxide film, and a silicon nitride film provided between the first silicon oxide film and the second silicon oxide film.

11. The device according to claim 10, wherein the protruding portion includes at least a portion of at least one selected from the first silicon oxide film, the second silicon oxide film, and the silicon nitride film.

12. The device according to claim 8, wherein at least one selected from the first layer and the second layer includes a single layer film or a stacked film, the single layer film including one selected from a semiconductor layer, a conductive layer, and an insulating layer, the stacked film including at least two selected from a semiconductor layer, a conductive layer, and an insulating layer.

13. The device according to claim 8, wherein the columnar structural unit includes a first column provided in the first layer and a second column provided in the second layer, an alignment axis of the first column and an alignment axis of the second column being shifted from each other.

* * * * *